(12) United States Patent
Sekiguchi (10) Patent No.: US 8,816,785 B2
(45) Date of Patent: Aug. 26, 2014

(54) OSCILLATOR

(75) Inventor: Ryota Sekiguchi, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/232,896

(22) Filed: Sep. 14, 2011

(65) Prior Publication Data

US 2012/0068778 A1 Mar. 22, 2012

(30) Foreign Application Priority Data

Sep. 22, 2010 (JP) ................................. 2010-211950
Aug. 9, 2011 (JP) ................................. 2011-173939

(51) Int. Cl.
*H03K 3/315* (2006.01)

(52) U.S. Cl.
USPC ............... 331/107 T; 331/96; 331/107 SL; 331/66; 331/185; 332/135; 332/136

(58) Field of Classification Search
USPC ............ 331/96, 154, 107 SL, 107 T, 66, 185; 332/135, 136
See application file for complete search history.

(56) References Cited

U.S. PATENT DOCUMENTS 5,223,802 A * 6/1993 Harvey et al. ............. 331/177 R
7,590,401 B1 * 9/2009 Frazier ......................... 455/334

FOREIGN PATENT DOCUMENTS

JP 3923260 B2 5/2007

OTHER PUBLICATIONS

Reddy et al., "Monolithic Schottky-Collector Resonant Tunnel Diode Oscillator Arrays to 650 GHz," IEEE Electron Device Letters, vol. 18 No. 5, May 1997, pp. 218-221.

* cited by examiner

*Primary Examiner* — Arnold Kinkead
(74) *Attorney, Agent, or Firm* — Canon U.S.A., Inc. IP Division (57) ABSTRACT

An oscillator which oscillates electromagnetic waves includes a negative differential resistance element, a resonator configured to prescribe oscillation frequencies of the electromagnetic waves, a voltage modulation unit configured to modulate the negative differential resistance element, a stabilizing circuit configured to suppress parasitic oscillation, and a bias circuit, including a power supply and a line, used to control an operating point voltage of the negative differential resistance element. The voltage modulation unit is connected to the bias circuit through the stabilizing circuit.

9 Claims, 11 Drawing Sheets

OSCILLATOR

BACKGROUND OF THE INVENTION

1. Field of the Invention

The present invention relates to oscillators used as oscillation mixer apparatuses including negative differential resistance elements for generating electromagnetic waves. The present invention particularly relates to an oscillator which oscillates electromagnetic waves in a frequency band within a frequency region from a millimeter waveband to terahertz waveband (equal to or larger than 30 GHz to equal to or smaller than 30 THz).

2. Description of the Related Art

As has been broadly recognized, a negative differential resistance element is useful in an application field of oscillators which generate electromagnetic waves when being used with a resonator. The negative differential resistance element generates electromagnetic waves (hereinafter simply referred to as terahertz waves) including at least a number of frequency components in the frequency band in the range from the millimeter waveband to the terahertz waveband (equal to or larger than 30 GHz to equal to or smaller than 30 THz). As an example, an oscillator including a negative differential resistance element on a substrate in a monolithic manner is disclosed in "IEEE Electron Device Letters, Vol 18, 218 (1997)". A slot antenna is disposed on the semiconductor substrate including the negative differential resistance element in an integration manner and a resonance configuration and a gain medium are configured in a monolithic manner.

Figure 10:
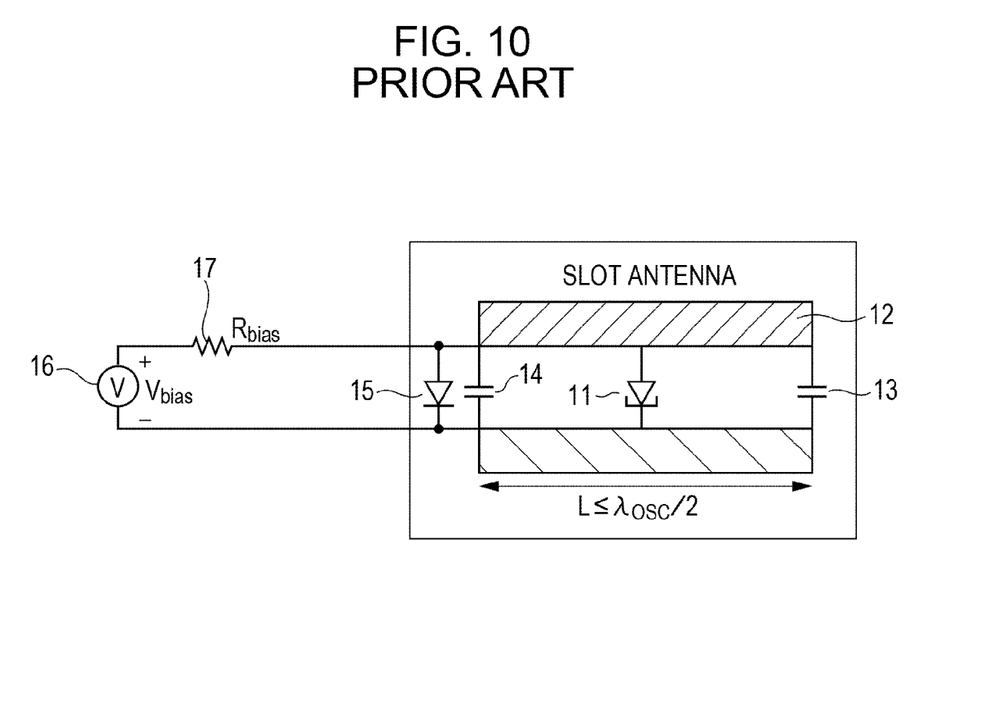
FIG. 10 is a diagram schematically illustrating a configuration of an oscillator according to the related art.

FIG. 10 is a diagram illustrating an oscillator disclosed in "IEEE Electron Device Letters, Vol 18, 218 (1997)". This oscillator includes a resonant-tunneling diode S-RTD 11 having a Schottky barrier on a collector side as a negative differential resistance element. As a resonator, a slot antenna is used. The slot antenna according to "IEEE Electron Device Letters, Vol 18, 218 (1997)" includes a metallic pattern 12 disposed on a semiconductor substrate, and further includes capacitors 13 and 14 at opposite ends of the pattern. The oscillator according to "IEEE Electron Device Letters, Vol 18, 218 (1997)" further includes a rectifier diode 15. Here, the rectifier diode 15 functions as a stabilizing circuit used to suppress parasitic oscillation which causes a problem in oscillators employing negative differential resistance elements. The parasitic oscillation means oscillation which is parasitically generated in a low frequency band and which is different from a desired frequency. Since such parasitic oscillation considerably deteriorates an oscillation output in a desired frequency, the presence of stabilizing circuits in oscillators employing negative differential resistance elements is considerably important. A detailed configuration will be described below. Assuming that an oscillation wavelength of an oscillator is denoted by $\lambda_{osc}$ and an oscillation frequency is denoted by $\omega_{osc}$, in order to suppress the parasitic oscillation, an impedance of a power source used to supply bias should be low in a frequency region in a range equal to or larger than DC and smaller than $\omega_{osc}$. Accordingly, as one method, a low impedance circuit (such as a shunt rectifier diode) should be disposed in a position within $\lambda_{osc}/4$ on the power source side relative to an S-RTD. Therefore, in FIG. 10, as such a low impedance circuit, the rectifier diode 15 is disposed in a position within $\lambda_{osc}/4$ on a power source 16 side relative to an S-RTD 11 in an integration manner. A resistance 17 represents the sum of an internal resistance of the power source 16 and a resistance included in a connection line.

Furthermore, by changing a capacitance component included in a resonator, an oscillator may have a variable oscillation frequency and variable amplitude. Japanese Patent No. 3923260 discloses a variable oscillator employing a Schottky diode disposed on a substrate including a negative resistance diode disposed thereon in an integration manner as a varactor (variable capacitance element). A capacitance of the varactor can be controlled by a power source disposed separately from a power source used to apply bias on the negative resistance diode. Therefore, the variable oscillator disclosed in Japanese Patent No. 3923260 can be used as a voltage controlled oscillator (VCO) to transmit millimeter waves which are oscillated and modulated by controlling the bias of the power source.

However, in the oscillators according to the related art, even if a control bias is modulated at ultrahigh speed, the oscillators may not follow the ultrahigh-speed modulation. This is because a stabilizing circuit should be inserted between such an oscillator and a power source in order to suppress parasitic oscillation unique to a negative differential resistance element. In this case, the stabilizing circuit includes a shunt resistance, for example, which is a comparatively low resistance. Taking this resistance and a parasitic inductance in a connection line which connects the power source and the stabilizing circuit to each other into consideration, a low-pass filter circuit is configured. That is, a modulation signal corresponding to a high frequency and ultrahigh speed is filtered by the stabilizing circuit. Therefore, negative differential resistance elements are not allowed to be modulated at ultrahigh speed in the oscillators according to the related art.

SUMMARY OF THE INVENTION

The present invention has been made in view of the problems described above, and the present invention provides an oscillator capable of modulating a negative differential resistance element at ultrahigh speed.

According to an embodiment of the present invention, there is provided an oscillator which oscillates electromagnetic waves including a negative differential resistance element, a resonator configured to prescribe oscillation frequencies of the electromagnetic waves, a voltage modulation unit configured to modulate the negative differential resistance element, a stabilizing circuit configured to suppress parasitic oscillation, and a bias circuit, including a power supply and a line, used to control an operating point voltage of the negative differential resistance element. The voltage modulation unit is connected to the bias circuit through the stabilizing circuit.

Accordingly, since the voltage modulation unit is disposed near the negative differential resistance element relative to the stabilizing circuit viewed from the bias circuit, the voltage of the negative differential resistance element may be modulated at ultrahigh speed (for example, a frequency band in a range including millimeter waves as described below). Accordingly, an oscillator capable of modulating an oscillation frequency and the like at ultrahigh speed can be provided. For example, assuming that an oscillation frequency is denoted by $\omega_0$ and a modulation frequency of the voltage modulation unit is denoted by $\omega_m$, an oscillation mixer apparatus capable of generating a difference frequency ($\omega_0-\omega_m$) and a sum frequency ($\omega_0+\omega_m$) obtained by mixing performed by the negative differential resistance element can be provided.

Further aspects of the present invention will become apparent from the following description of exemplary embodiments with reference to the attached drawings.

DESCRIPTION OF THE EMBODIMENTS

Important points of oscillators according to embodiments of the present invention are described below. Specifically, the oscillators employ a configuration for avoiding the filtering described above by taking an LR low-pass filter circuit generated by a resistance component R of a stabilizing circuit and a parasitic inductance component L of a bias circuit into consideration. Therefore, voltage modulation units of the embodiments of the present invention are disposed near negative differential resistance elements relative to stabilizing circuits. The voltage modulation units may be arbitrarily configured as long as the voltage modulation units can modulate the negative differential resistance elements. However, parasitic oscillation caused by a voltage modulation unit newly employed should be taken into consideration, and therefore, the voltage modulation units should be electrically isolated from external circuitry. On the basis of the consideration described above, the oscillators according to the embodiments of the present invention are basically configured as described above.

Hereinafter, the embodiments and examples according to the present invention will be described with reference to the attached drawings.

First Embodiment

Figure 1:
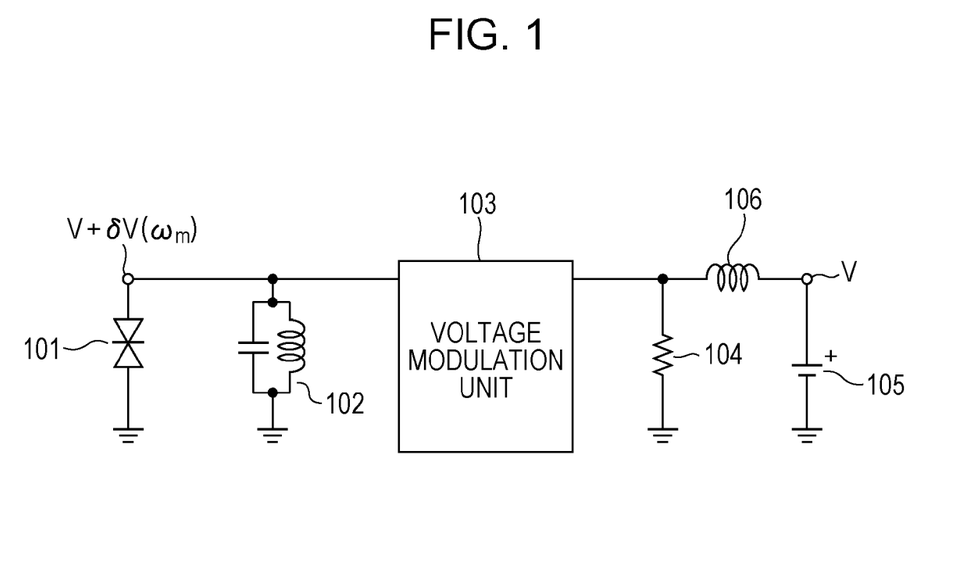
FIG. 1 is a diagram illustrating a configuration of an oscillator according to a first embodiment.

An oscillator according to a first embodiment will be described with reference to FIG. 1. FIG. 1 is a diagram illustrating a circuit configuration of the oscillator according to this embodiment.

The oscillator of this embodiment which includes a negative differential resistance element 101 and a resonator 102 which prescribes oscillation frequencies of electromagnetic waves oscillates electromagnetic waves in a frequency band in a range from a millimeter waveband to a terahertz waveband (equal to or larger than 30 GHz and equal to or smaller than 30 THz). The arrangement relationship between the negative differential resistance element 101 and the resonator 102 shown in FIG. 1 may be employed, and alternatively, the arrangement relationship in which positions of the negative differential resistance element 101 and the resonator 102 are replaced by each other may be employed. Furthermore, an inductance and a capacitance of the resonator 102 include an inductance component and a capacitance component of the negative differential resistance element 101, respectively in the description below. As the negative differential resistance element 101, a resonant-tunneling diode (RTD), an Esaki diode, or a Gunn diode is typically selected. Furthermore, a transistor having terminated one end may be used. The resonator 102 may be an LC resonator or a distributed constant antenna disclosed in "IEEE Electron Device Letters, Vol 18, 218 (1997)". A load resistance of the resonator 102 which is omitted in FIG. 1 corresponds to a value larger than an absolute value of a negative resistance in a negative resistance region of the negative differential resistance element 101.

A bias circuit includes a power source 105 and a line 106, and the line 106 having a finite length normally includes a parasitic inductance component. The power source 105 supplies current required for driving the negative differential resistance element 101 and controls a static voltage of an operating point. The operating point is typically selected from a negative resistance region, and a voltage of the operating point is V. A stabilizing circuit 104 which prevents the parasitic oscillation from being generated or suppresses the parasitic oscillation is simply constituted by a resistor in this embodiment. As with the case of "IEEE Electron Device Letters, Vol 18, 218 (1997)", a shunt element may be used and a capacitor may be disposed in parallel to the resistor. Here, a value of the resistor included in the stabilizing circuit 104 should be equal to or slightly smaller than an absolute value of a negative resistance in the negative resistance region of the negative differential resistance element 101 as stabilizing condition. Typically, the value is approximately 20Ω or smaller. The inductance of the line 106 is 1 nH or larger, for example. According to this numerical example, the low-pass filter circuit described above has an LR cutoff frequency $f_{LR}$ which is equal to or smaller than 3.2 GHz ($f_{LR}=1/(2\Pi L/R)$ =3.2 GHz).

Figure 9:
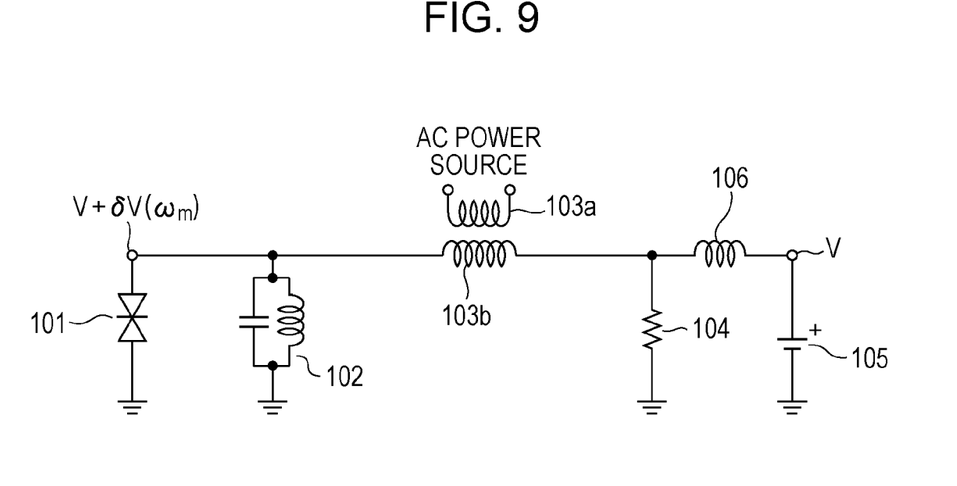
FIG. 9 is a diagram illustrating a configuration of a voltage modulation unit of the oscillator according to the first embodiment.

In order to avoid the filtering performed by the LR low-pass filter, a voltage modulation unit 103 which modulates a voltage of the negative differential resistance element 101 is connected to the bias circuit including the power source 105 and the inductance 106 through the stabilizing circuit 104. It is apparent that the voltage modulation unit 103 is also connected to the negative differential resistance element 101 the voltage of which is to be modulated. As described above, the voltage modulation unit 103 is connected to the stabilizing circuit 104 and the negative differential resistance element 101. The voltage modulation unit 103 may be constituted by a resonator which is different from the resonator 102 or photocoupler (these configurations will be described in embodiments below). Alternatively, a transformer may be used. In the transformer, as shown in FIG. 9, a secondary winding wire 103b is connected to a primary winding wire 103a which is connected to an AC power source. Any connection configuration may be employed as long as a voltage on the negative differential resistance element side relative to the voltage modulation unit 103 (the left side in FIG. 1) is modulated to V+δV($\omega_m$) against the voltage V on the stabilizing circuit side relative to the voltage modulation unit 103 (the right side in FIG. 1). Here, δV($\omega_m$) denotes a voltage which is temporally modulated. The embodiment of the present invention is characterized in that a modulation (angle) frequency $\omega_m$ larger than $2\Pi f_{LR}$ which is an ultrahigh speed frequency band may be used.

Figure 2A:
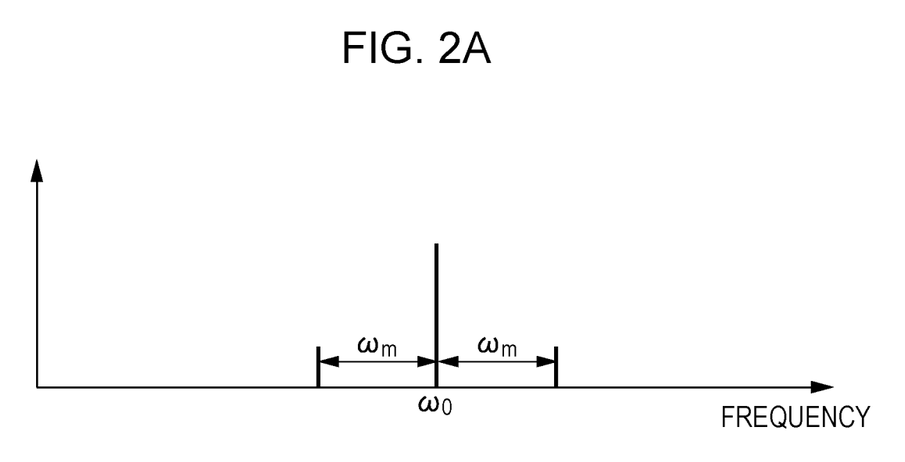
FIG. 2A is a diagram illustrating generation frequencies of the oscillator according to the first embodiment (in a case where a modulation depth is small).
Figure 2B:
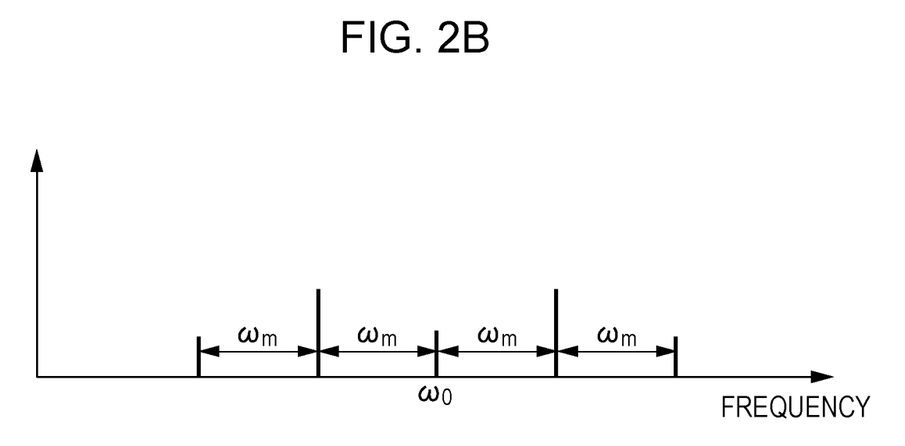
FIG. 2B is a diagram illustrating generation frequencies of the oscillator according to the first embodiment (in a case where a modulation depth is large).

Since the negative differential resistance element 101 has nonlinearity (that is, the relationship I(V) between the voltage V and a current I is not linear; the negative differential resistance element 101 normally has nonlinearity) around the operating point voltage V, the negative differential resistance element 101 can mix an oscillation frequency $\omega_0$ and the modulation frequency $\omega_m$ with each other. Accordingly, the oscillator according to this embodiment can generate a difference frequency ($\omega_0-\omega_m$) or a sum frequency ($\omega_0+\omega_m$) in the vicinity of the oscillation (angle) frequency $\omega_0$ as shown in FIG. 2A. The relationship between the oscillation frequency $\omega_0$ and the modulation frequency $\omega_m$ is generally defined by an amount referred to as a "modulation depth". When the modulation depth is comparatively small, a frequency of $\omega_0 \pm \omega_m$ is generated as shown in FIG. 2A whereas when the modulation depth is comparatively large, frequencies of $\omega_0 \pm \omega_m$, $\omega_0 \pm 2\omega_m$, and so on are generated as shown in FIG. 2B. Therefore, the oscillator of this embodiment functions as an oscillation mixer apparatus capable of generating a plurality of frequencies. Note that the number of voltage modulation units is not limited to one, and a plurality of voltage modulation units may be provided. In this case, the plurality of voltage modulation units are individually connected to the negative differential resistance element 101. Furthermore, when switches are added to the individual voltage modulation units, switching can be performed to select a modulation frequency.

Second Embodiment

Figure 3:
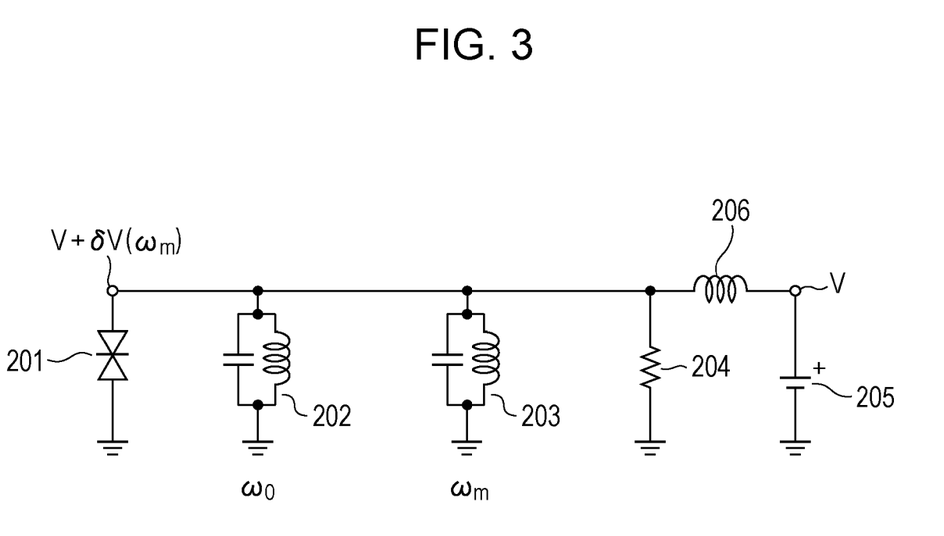
FIG. 3 is a diagram illustrating a configuration of an oscillator according to a second embodiment.

An electromagnetic wave generation element according to a second embodiment will be described with reference to FIG. 3. FIG. 3 is a diagram illustrating a circuit configuration of an oscillator of this embodiment serving as a modification of the first embodiment.

This embodiment is specifically different from the first embodiment in that the voltage modulation unit 103 is configured by a resonator 203 having a modulation frequency of $\omega_m$. Other configurations are the same as those of the first embodiment. That is, the oscillator includes a negative differential resistance element 201, a resonator 202 having an oscillation frequency of $\omega_0$, a stabilizing circuit including a resistor 204, and a bias circuit including a power source 205 and a line 106. A resonator 203 having a modulation frequency of $\omega_m$ may be a distributed constant resonator. In this case, the negative differential resistance element 201 oscillates the oscillation frequency $\omega_0$ of the first resonator 202 and the modulation frequency $\omega_m$ of the second resonator 203 simultaneously.

When a frequency comb generator generating frequencies in even intervals is configured, the resonator 203 is preferably constituted by an LC resonator having a single modulation frequency $\omega_m$. In this case, an inductance component L and a capacitance component C of the LC resonator 203 may be constituted by a strip conductor and an MIM (Metal-Insulator-Metal) capacitor, respectively. This is because a monolithic oscillator can be configured on a substrate. To generate the inductance component L by the strip conductor, when an equivalent wavelength of the modulation frequency $\omega_m$ is $\lambda_m$, a length of the strip conductor is preferably set to sufficiently smaller than $\lambda_m/4$. This is because a transmission line having a length smaller than $\lambda/4$ has an induction property and a transmission line having a length larger than $\lambda/4$ and smaller than $\lambda/2$ has a capacitive property. The present invention is not limited to this and a meander transmission line and a coil such as a chip inductor having a comparatively large inductance may be used to reduce a space for the provision of the MIM capacitor.

Figure 4A:
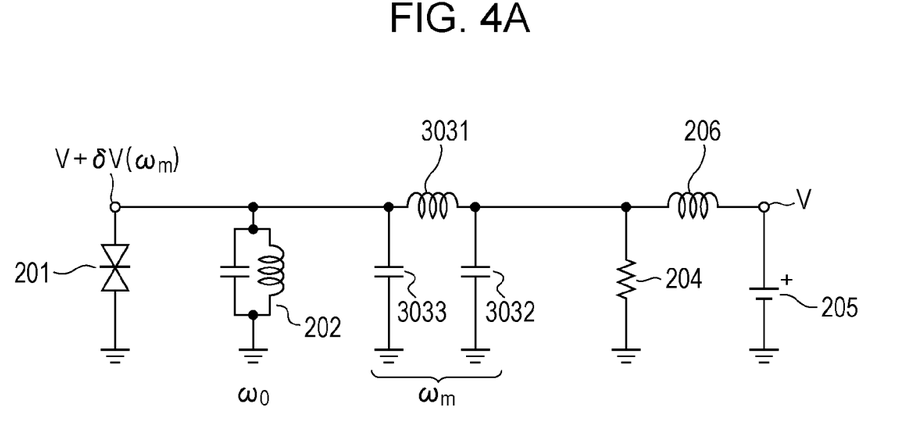
FIG. 4A is a diagram illustrating a configuration of an oscillator according to a modification of the second embodiment.

FIG. 4A illustrates a circuit configuration serving as an example of the LC resonator. An inductance L 3031 and a capacitor C 3033 constitute a resonator having a modulation frequency of $\omega_m=1/\sqrt{(LC)}$, and a capacitor 3032 used for DC cut is provided so that a current is not directly supplied from a bias power source 205 to the ground.

Figure 4B:
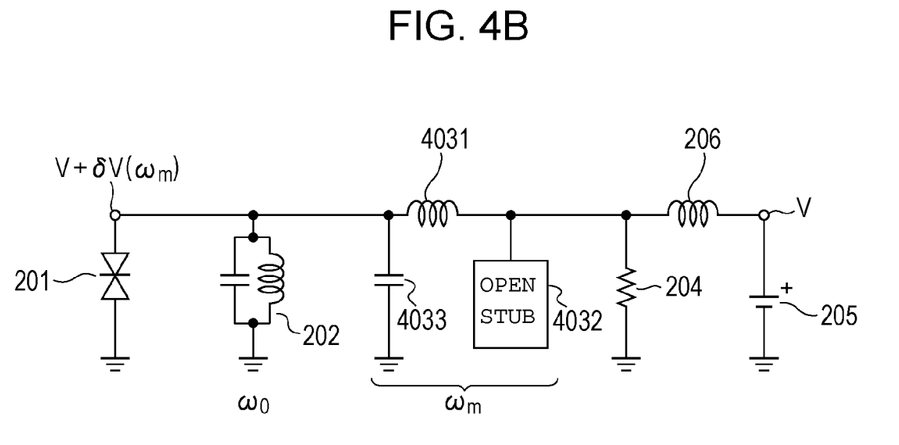
FIG. 4B is a diagram illustrating a configuration of an oscillator according to another modification of the second embodiment.

When a multi-frequency generator having a plurality of generation frequencies is configured, the LC resonator 203 is preferably a distributed constant resonator such as a dielectric resonator which generates a plurality of modulation frequencies $\omega_m$. In this case, the plurality of modulation frequencies $\omega_m$ are determined by a shape of the distributed constant resonator 203, and include various modes including a basic resonance mode $\omega_{m1}$ to the n-order resonance mode $\omega_{mn}$ ($\omega_{mn}$ is not necessarily n-times $\omega_{m1}$). Accordingly, a number of frequencies ($\omega_0+\omega_{m1}$), ($\omega_0-\omega_{m1}$), ... ($\omega_0+\omega_m$), ($\omega_0-\omega_{mn}$) can be generated. A hybrid resonator constituted by combining lumped parameter elements such as L and C and a distributed constant such as a stub with each other may be employed. FIG. 4B shows a circuit configuration serving as an example of the hybrid resonator. An inductance L 4031 and a capacitor C 4033 constitute a resonator having a modulation frequency of $\omega_m=1\sqrt{(LC)}$, and an open stub 4032 is provided so that a current is not directly supplied from the bias power source 205 to the ground. In this case, the inductance L is a hybrid inductance. The inductance L functions as a pure inductance when the open stub 4032 functions as an AC-grounded $\lambda/4$ stub, an AC-grounded $3\lambda/4$ stub, an AC-grounded $5\lambda/4$, and so on. In this case, the plurality of modulation frequencies $\omega_m$ are determined as $1/\sqrt{(L_{\lambda/4}C)}$, $1/\sqrt{(L_{3\lambda/4}C)}$, $1/\sqrt{(L_{5\lambda/4}C)}$, and so on in this order.

Third Embodiment

Figure 5:
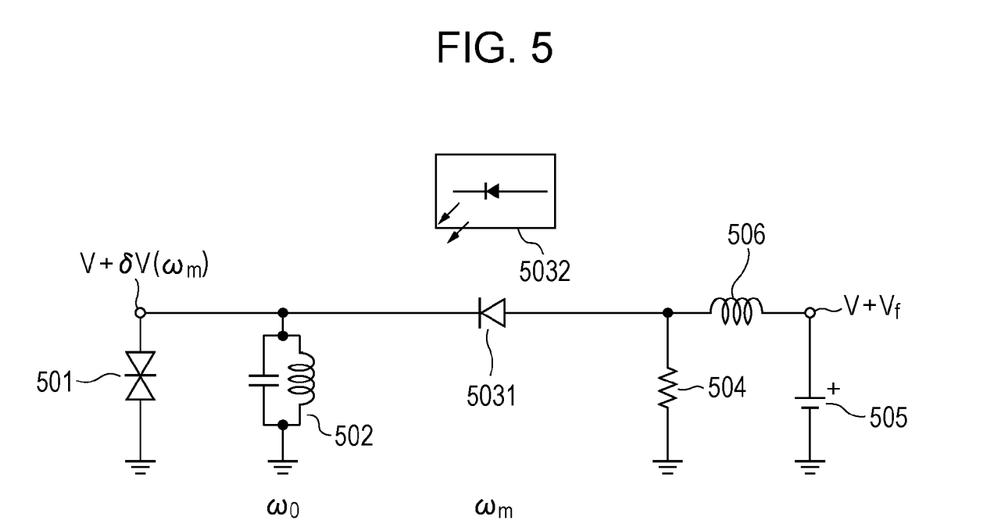
FIG. 5 is a diagram illustrating a configuration of an oscillator according to a third embodiment.

An electromagnetic wave generation element according to a third embodiment will be described with reference to FIG. 5. FIG. 5 is a diagram illustrating a circuit configuration of an oscillator of this embodiment serving as a modification of the first embodiment.

This embodiment is specifically different from the first embodiment in that the voltage modulation unit 103 is configured by photocoupler which transmit and receive a modulation frequency $\omega_m$. Use of the photocoupler enables a voltage modulation unit to be electrically isolated and a modulation frequency to be variable. Other configurations are the same as those of the first embodiment. That is, the oscillator includes a negative differential resistance element 501, a resonator 502 having an oscillation frequency of $\omega_0$, a stabilizing circuit (resistor) 504, and a bias circuit including a power source 505 and an inductance 506. Since a transmission optical element 5032 and a reception optical element 5031 are electrically isolated from each other, the photocoupler does not cause capacitance oscillation, which is preferable. Furthermore, in this embodiment, the modulation frequency $\omega_m$ can be controlled at high speed from the side of the transmission optical element 5032. For example, the modulation frequency $\omega_m$ may be switched by 10 GHz. This is the important characteristic of this embodiment since a modulation frequency can be freely controlled when compared with the modulation frequency which is basically fixed in the second embodiment.

In this embodiment, the photodiode included in the reception optical element 5031 has a cathode connected to the negative differential resistance element 501 and an anode connected to the stabilizing circuit 504. Accordingly, a voltage of the power source 505 is more applied by a turn-on voltage $V_f$ of the reception optical element 5031. Furthermore, a photocurrent supplied to an element resistor of the photodiode when the photodiode included in the reception optical element 5031 received light generates a potential difference $\delta V$. Accordingly, a voltage on a negative differential resistance element side (the left side in FIG. 5) is modulated to $V+\delta V(\omega_m)$ relative to a voltage $V+V_f$ on a stabilizing circuit side (the right side in FIG. 5). The modulation frequency $\omega_m$ is obtained by modulating an output of the photodiode of the transmission optical element 5032 by a synthesizer, not shown, and an oscillation frequency of the synthesizer corresponds to the modulation frequency $\omega_m$. Note that, in the circuit configuration described above, a layer of the photodiode of the reception optical element 5031 may be stacked on a layer of the negative differential resistance element 501 (or vice versa) so as to be monolithically configured on a same substrate.

The oscillator of this embodiment represents a preferred example of an oscillator used for ultrahigh speed communication in side bands of $(\omega_0+\omega_m)$ and $(\omega_0-\omega_m)$.

Examples of the oscillator will be further described in detail below.

First Example

Figure 6A:
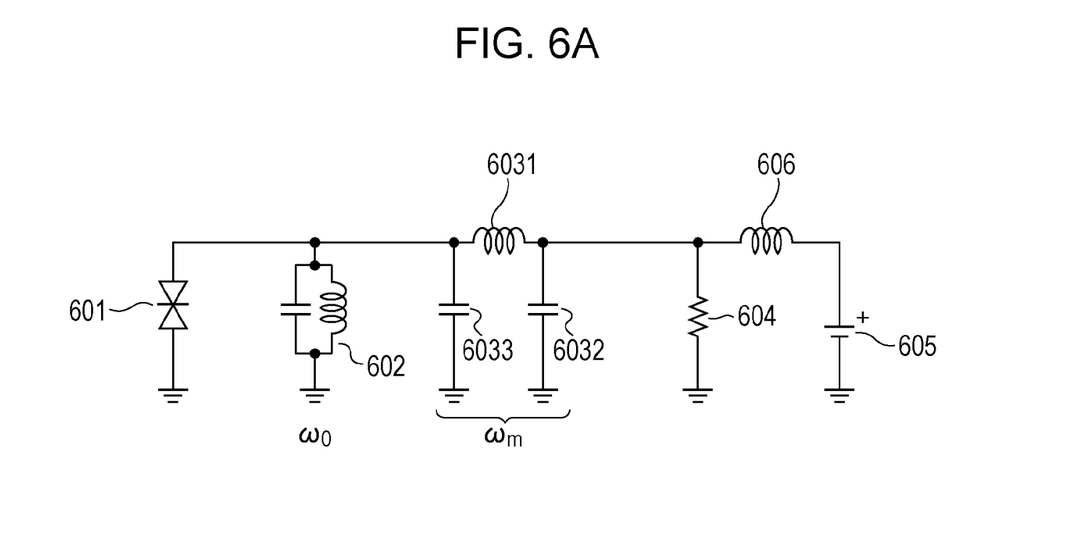
FIG. 6A is a diagram illustrating a circuit configuration of an oscillator according to a first example.
Figure 6B:
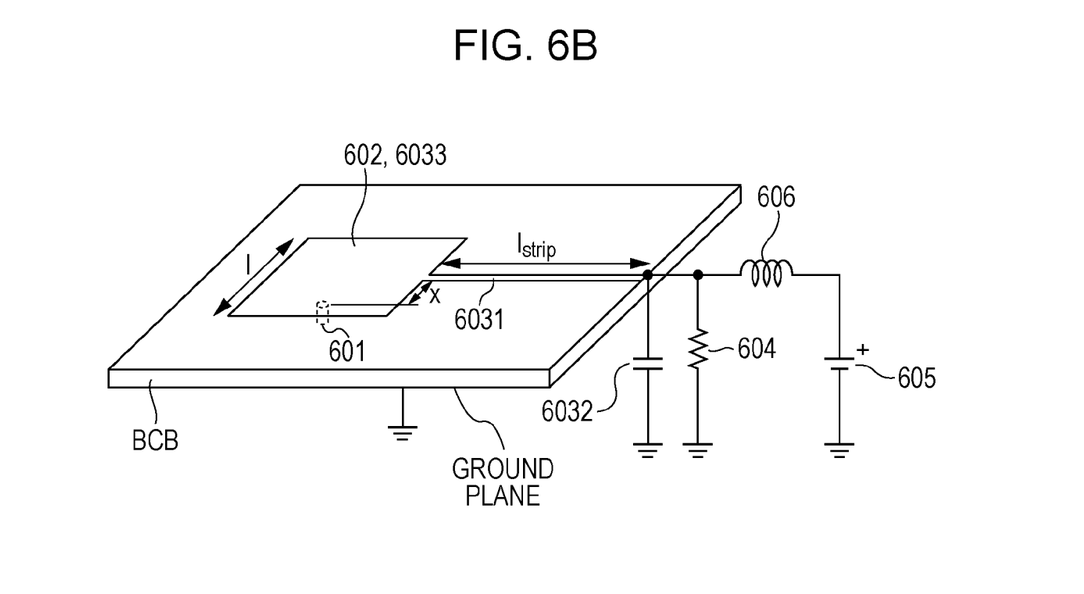
FIG. 6B is a diagram illustrating an integrated configuration of a portion of the circuit configuration of the oscillator according to the first example.

A first example of the second embodiment will be described in detail. An oscillator (a frequency comb generator) of this example will be described with reference to FIGS. 6A and 6B. FIG. 6A is a diagram illustrating a circuit configuration of the oscillator according to the first example. FIG. 6B is a diagram illustrating a configuration in which a portion of a circuit configuration is disposed in an integration manner.

In this example, a reference numeral 601 denotes a resonant-tunneling diode (RTD). The RTD 601 is configured by a multiple quantum well structure constituted by InGaAs/InAlAs and InGaAs/AlAs on an InP substrate and electric contact layers constituted by n-InGaAs. As the multiple quantum well structure, a triple barrier structure is employed. More specifically, a semiconductor multi-layer film structure of AlAs(1.3 nm)/InGaAs(7.6 nm)/InAlAs(2.6 nm)/InGaAs(5.6 nm)/AlAs(1.3 nm) is employed. Among these, InGaAs layers correspond to a well layer, lattice-matched InAlAs layer and lattice-mismatched AlAs layer correspond to a barrier layer. These layers remain as undoped layers which are not intentionally subjected to carrier doping. This multi quantum well structure is sandwiched between the electric contact layers of n-InGaAs having electron concentration of $2\times10^{18}$ cm$^{-3}$. In a current-voltage I(V) characteristic of the configuration between the electric contact layers, a peak current density is 280 kA/cm$^2$ and a range from approximately 0.7 V to approximately 0.9 V corresponds to a negative resistance region. When the RTD 601 has a mesa structure of approximately 3 $\mu$m$\Phi$, a peak current of 20 mA and a negative resistance of $-10\Omega$ are obtained.

Next, a reference numeral 602 denotes a terahertz wave resonance circuit utilizing a patch antenna. As the patch antenna included in the resonance circuit 602, a conductive patch of 50$\Omega$ having a square pattern of l=200 $\mu$m and having an oscillation frequency set to approximately 0.4 THz is used. The RTD 601 is disposed on an outer side relative to the center of the patch by x=40 $\mu$m. The patch antenna of the resonance circuit 602 serves as one electrode of the RTD 601, and a ground conductor ("Ground plane" in FIG. 6B) which is isolated by a dielectric body ("BCB" in FIG. 6B) serves as the other electrode of the RTD 601. Accordingly, the patch antenna constitutionally serves as an element of a millimeter waveband capacitor 6033.

A reference numeral 6031 denotes a microstrip line of 50$\Omega$ having a width of 12 $\mu$m and a length $l_{strip}$=100 $\mu$m. In this example, a common conductor ("Ground plane" in FIG. 6B) is used as the ground conductor of the patch antenna of the resonance circuit 602 and a ground conductor of the microstrip line 6031. The microstrip line 6031 has a role of an inductance in the vicinity of a modulation frequency band (millimeter waveband, for example) in addition to a role for supplying a bias from a bias circuit including a power source 105 and a line 106 to a negative differential resistance element including the RTD 601. Therefore, in FIG. 6A, the microstrip line 6031 is represented by a symbol of an inductance. A value of the inductance of the microstrip line 6031 is approximately 0.02 nH in the millimeter waveband.

A reference numeral 6032 denotes a capacitor. For example, an MIM capacitor disposed on the same InP substrate may be used. Although a capacitance of approximately several pF is used in this embodiment, a larger value of the capacitance is more suitable for approximation of the inductance value described above. For example, when a capacitance is equal to or larger than 30 pF, a function of the microstrip line 6031 as an inductance can be expanded to approximately 30 GHz toward a low frequency side. More precisely, an imaginary component of an input impedance of the microstrip line 6031 which is terminated by the capacitor 6032 in an expression below should be referred to $$Z_{in}=Z_0(Z_{6032}+jZ_0\tan(L))/(Z_0+jZ_{6032}\tan(\beta L))$$

where "$\beta$" represents $2\Pi/\lambda$ of the microstrip and "L" represents a length of the microstrip. Furthermore, "$Z_0$" represents a characteristic impedance of the microstrip, and "$Z_{6032}=1/j\omega C_{6032}$" denotes an impedance of the capacitor 6032 having a capacitance C. Note that, when a stabilizing circuit 604 is also taken into consideration, "$Z_{6032}$" in the foregoing expression is replaced by "$1/(Y_{604}+j\omega C_{6032})$". Here, "$Y_{604}$" denotes an admittance of the stabilizing circuit 604. The admittance $Y_{604}$ does not deteriorate accuracy of the approximation described above.

Since a voltage modulation unit in this example is an LC resonator having an inductance of the microstrip line 6031 of 0.02 nH and a capacitance of the capacitor 6033 of 0.28 pF, an LC resonant frequency of the LC resonator is calculated to be 67 GHz. An oscillation frequency of approximately 0.4 THz is modulated using the LC resonant frequency.

Figure 7:
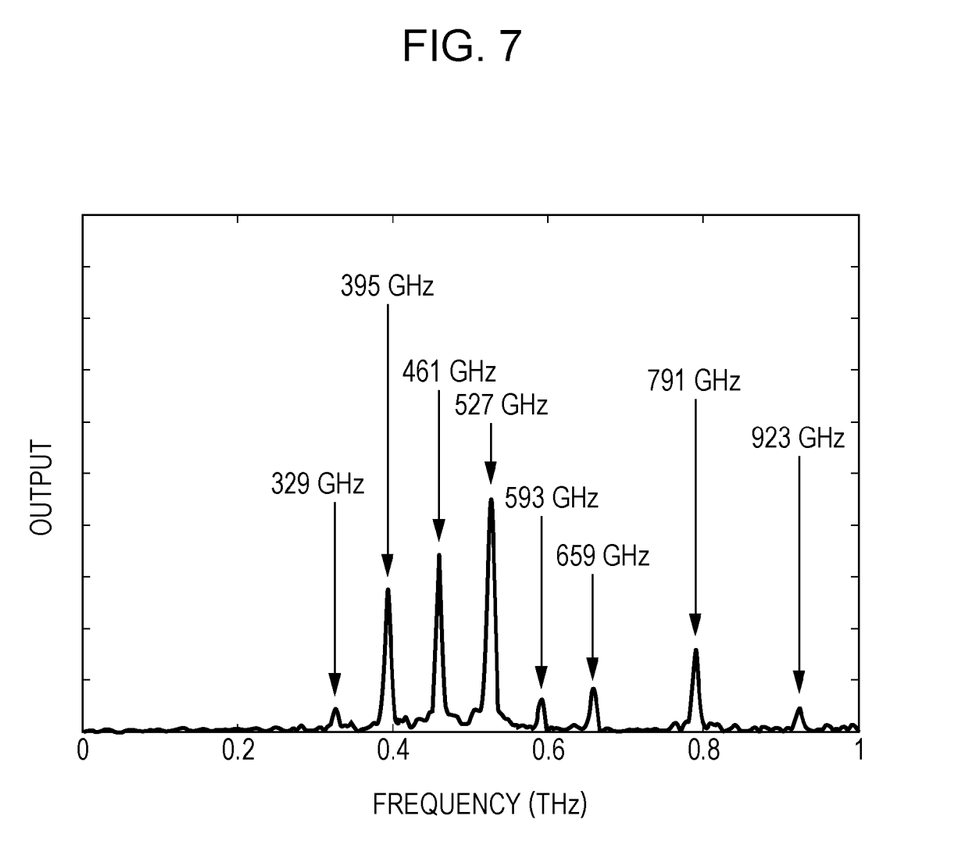
FIG. 7 is a diagram illustrating generation frequencies of the oscillator and a frequency comb generator according to the first example.

FIG. 7 is a diagram illustrating frequencies generated by the oscillator (the frequency comb generator) of this example. When the apparatuses of this example are driven by an operating point voltage of approximately 0.8 V, comb shape frequencies of 66 GHz are generated in the vicinity of an oscillation frequency of 395 GHz. Assuming that pulse driving with a repetition frequency of 300 Hz (Duty 10%) is set as a driving condition, generation frequencies are dispersed using an FT-IR spectral apparatus. In FIG. 7, generation of frequencies of $(\omega_0-\omega_{m1})$=329 GHz, $\omega_0$=395 GHz, $(\omega_0+\omega_m)$=461 GHz, $(\omega_0+2\omega_m)$=527 GHz, $(0)_0-3\omega_m)$=593 GHz, and $(\omega_0-4\omega_m)$=659 GHz can be recognized. Intervals between the frequencies are precisely 66 GHz. Since an output of $(\omega_0+2\omega_m)$ is larger than an output of $\omega_0$, a comparatively large modulation depth is expected. Furthermore, although frequencies of 791 GHz and 923 GHz are also recognized, it is considered that the frequency of 791 GHz is a second harmonic of double the basic wave oscillation of 395 GHz, and the frequency of 923 GHz is a component obtained by modulating the second harmonic by 66 GHz. As described above, in this example, the frequency comb generator capable of generating a plurality of electromagnetic waves having frequencies having intervals therebetween corresponding to a modulation frequency of the voltage modulation unit or an integral multiple of the modulation frequency by controlling the operating point voltage can be configured.

The oscillator of this example represents a preferred example which can be used as a process inspection apparatus which measures reflection and transmission of a plurality of frequencies.

Second Example

Figure 8A:
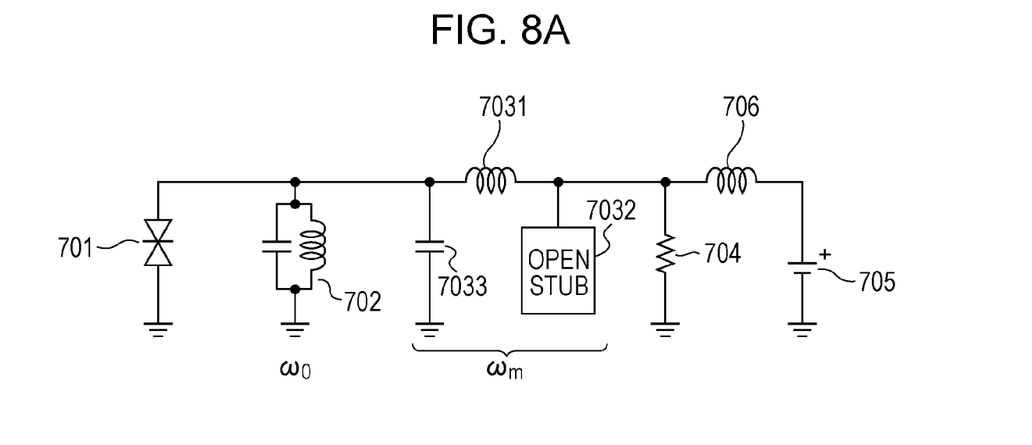
FIG. 8A is a diagram illustrating a circuit configuration of an oscillator according to a second example.
Figure 8B:
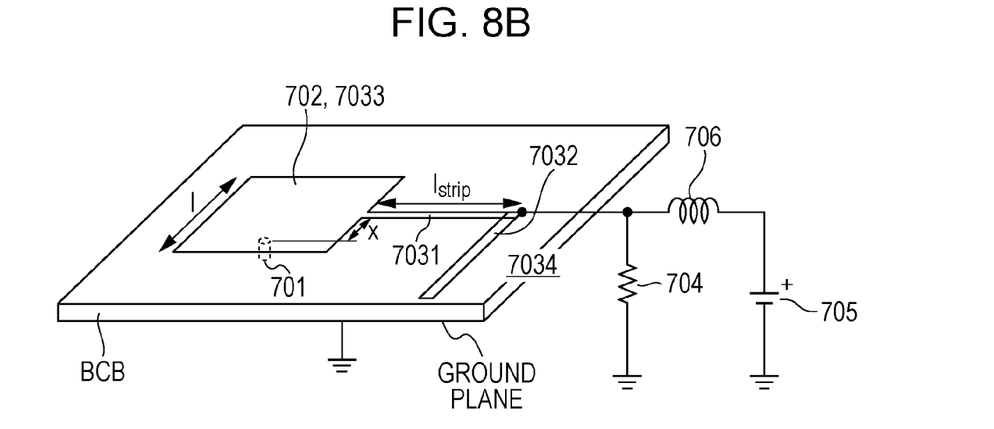
FIG. 8B is a diagram illustrating an integrated configuration of a portion of a circuit configuration of the oscillator according to the second example.
Figure 8C:
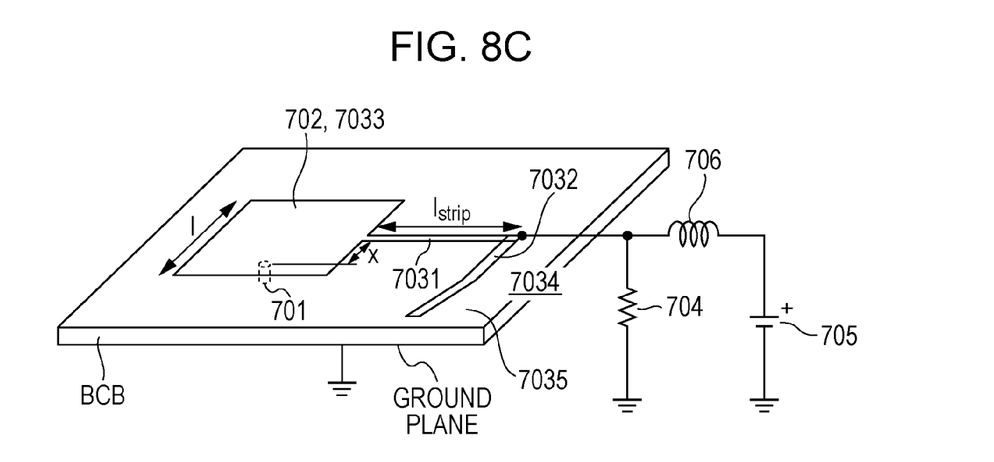
FIG. 8C is a diagram illustrating another integrated configuration of the portion of the circuit configuration of the oscillator according to the second example.

A second example of the second embodiment will be described in detail. An oscillator of this example will be described with reference to FIGS. 8A to 8C. FIG. 8A is a diagram illustrating a circuit configuration of the oscillator according to the second example. FIGS. 8B and 8C are diagrams illustrating configurations in which a portion of a circuit configuration is disposed in an integration manner.

This example is a modification of the first example, and an open stub 7032 is used instead of the capacitor 6032 and the stub is constituted by bimetal. Other configurations are the same as those of the first example. That is, the oscillator includes an RTD 701, resonance circuit 702 including a patch antenna, a stabilizing circuit 704 (register), and a bias circuit including a power source 705 and a line 706. Furthermore, as with the first example, the patch antenna of the resonance circuit 702 (l=200 μm, x=40 μm) also functions as a millimeter waveband capacitor 7033, and a reference numeral 7031 denotes a microstrip ($l_{strip}$=100 μm).

The open stub 7032 is designed so as to have a length of λ/4 at 67 GHz. For example, assuming that a width of the stub is 12 μm which is the same as that of the microstrip 7031, a length of 1 mm corresponds to λ/4. In this case, since a base (a portion which intersects with the microstrip 7031) of the open stub 7032 is AC short-circuited, the microstrip 7031 serves as an inductance in the vicinity of the frequency of 67 GHz. Note that, since the open stub 7032 similarly operates at 200 GHz corresponding to 3λ/4, a resonant frequency of a distributed constant resonator is calculated to be 67 GHz, 200 GHz. Assuming that the resonant frequencies are denoted by $\omega_{m1}$ and $\omega_{m2}$, for example, in addition to a frequency $(\omega_0-\omega_{m1})$, a frequency $(\omega_0-\omega_{m2})$=(395−200) GHz=195 GHz can be generated.

Furthermore, in this example, the open stub 7032 is deformed owing to thermal application performed by a thermal control unit 7034. The thermal control unit 7034 is electrically isolated from the rest of the circuits of the oscillator and serves as a control unit which enables modulation frequencies of the voltage modulation unit to be variable. FIGS. 8B and 8C represent a state in which thermal deformation has not occurred and a state in which the thermal deformation has occurred, respectively. FIG. 8B shows a state in which the stub is not deformed whereas FIG. 8C shows a state in which a tip portion corresponding to a region of half of the stub is lifted from a surface of a dielectric body ("BCB" in FIG. 8C). In this case, a gap (space) 7035 is formed, in addition to the dielectric body, between the stub and a ground conductor ("Ground plane" in FIG. 8C). Therefore, an equivalent wavelength of the open stub 7032 of 1 mm is reduced and the resonant frequencies $\omega_{m1}$ and $\omega_{m2}$ are shifted to a high frequency side. In this case, an amount of shift in a higher-order resonant mode such as the resonant frequency $\omega_{m2}$ becomes larger than that of the resonant frequency $\omega_{m1}$. Typically, since an n-order resonant mode performs shift n-times larger than shift of the basic resonant mode, frequency generation obtained by mixing an oscillation frequency and the high-order resonant mode with each other may be employed in application which requires a comparatively large shift amount.

In the foregoing description, a modulation frequency $\omega_{mn}$ is variable since the bimetal is used. However, the present invention is not limited to this, and a method utilizing electrophoretic migration in the dielectric body or a method utilizing liquid crystal in the dielectric body may be considered. However, the voltage modulation unit is preferably electrically isolated from external circuitry.

Furthermore, a method for applying stress on the RTD may be considered. Not only the modulation frequency $\omega_{mn}$ but also an oscillation frequency $\omega_0$ is set to be variable by using the method. The oscillator of this example represents a preferred example of an oscillator which is applicable to a spectral device which observes an absorption spectrum in a plurality of frequency bands.

Third Example

Figure 11:
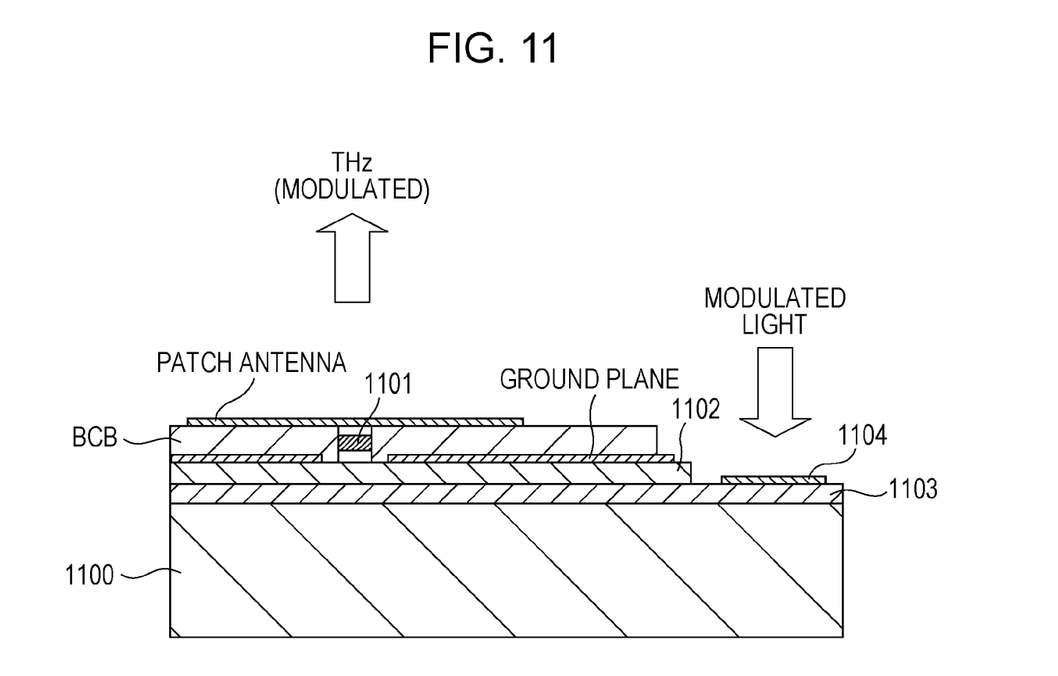
FIG. 11 is a sectional view illustrating a portion of a circuit configuration of an oscillator according to a third example.

A third example corresponding to the third embodiment will be described in detail. An oscillator according to this example will be described with reference to FIG. 11. FIG. 11 is a sectional view illustrating a configuration in which a negative differential resistance element and a photodiode are integrally mounted on the same substrate. Similarly to the first example, an RTD is used for a negative differential resistance element layer 1101. As with the first example, the RTD has layers processed to be a mesa structure and is connected to a patch antenna and a ground conductor. The patch antenna may be the same as that of the first example. In this example, beneath the negative differential resistance element layer 1101, an n-InGaAs layer 1102 of 400 nm and an n-InP layer 1103 of 400 nm are arranged. A surface of the n-InP layer 1103 is exposed and a Schottky electrode 1104 is disposed on a portion of the surface. Specifically, in the third example, the RTD and the Schottky diode are integrally mounted on the same substrate 1100. The Schottky diode may be used as a photodiode, and since the Schottky diode is a single carrier diode (electronic diode in this example), a response at ultrahigh speed of 10 GHz or more may be performed. A pn diode (pin diode) having a speed which is lower than the speed of 10 GHz may be used. As shown in the drawing, when light is incident from a front surface or a back surface in a case of 1.5 μm band, a characteristic is changed and an operation point of the RTD may be modulated. Therefore, terahertz waves to be emitted may be modulated. In this configuration, since a ground electrode of the RTD and a cathode of the Schottky diode are arranged adjacent to each other and connected to each other through an n-InGaAs layer 1102, series resistance and floating capacitance which cause a problem in a ultrahigh-speed operation are reduce. A bias circuit or a stabilizing circuit, not shown, may be employed as described in the third embodiment.

The oscillator of this example is a preferred example of an oscillator used for ultrahigh speed communication, for example, in side bands of an oscillation frequency $\omega_0$ of the patch antenna.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-211950 filed Sep. 22, 2010 and No. 2011-173939 filed Aug. 9, 2011, which are hereby incorporated by reference herein in their entirety.

What is claimed is:

1. An oscillator which oscillates electromagnetic waves, comprising:
   a negative differential resistance element;
   a resonator configured to prescribe an oscillation frequency of the electromagnetic waves;
   a voltage modulation unit configured to modulate a voltage of the negative differential resistance element with a modulation frequency;
   a stabilizing circuit configured to suppress parasitic oscillation; and
   a bias circuit, including a power supply and a line, used to control an operating point voltage of the negative differential resistance element,
   wherein the voltage modulation unit is connected to the bias circuit through the stabilizing circuit,
   wherein the modulation frequency is different from the oscillation frequency; and
   wherein the voltage modulation unit includes a separate resonator provided independently from the resonator and resonance frequencies of the resonator and the separate resonator are different from each other.

2. The oscillator according to claim 1,
   wherein the separate resonator includes a strip conductor.

3. An oscillator which oscillates electromagnetic waves, comprising:
   a negative differential resistance element;
   a resonator configured to prescribe an oscillation frequency of the electromagnetic waves;
   a voltage modulation unit configured to modulate a voltage of the negative differential resistance element with a modulation frequency;
   a stabilizing circuit configured to suppress parasitic oscillation; and
   a bias circuit, including a power supply and a line, used to control an operating point voltage of the negative differential resistance element,
   wherein the voltage modulation unit is connected to the bias circuit through the stabilizing circuit,
   wherein the modulation frequency is different from the oscillation frequency, and
   wherein the voltage modulation unit includes a photocoupler including a photodiode connected between the negative differential resistance element and the stabilizing circuit.

4. The oscillator according to claim 3,
   wherein the photodiode includes a cathode connected to the negative differential resistance element and an anode connected to the stabilizing circuit.

5. The oscillator according to claim 3,
   wherein the photodiode is a Schottky diode.

6. An oscillator which oscillates electromagnetic waves, comprising:
   a negative differential resistance element;
   a resonator configured to prescribe an oscillation frequency of the electromagnetic waves;
   a voltage modulation unit configured to modulate a voltage of the negative differential resistance element with a modulation frequency;
   a stabilizing circuit configured to suppress parasitic oscillation; and
   a bias circuit, including a power supply and a line, used to control an operating point voltage of the negative differential resistance element,
   wherein the voltage modulation unit is connected to the bias circuit through the stabilizing circuit,
   wherein the modulation frequency is different from the oscillation frequency; and
   wherein the voltage modulation unit includes a control unit which is electrically isolated and which causes the modulation frequency of the voltage modulation unit to be variable.

7. An oscillator which oscillates electromagnetic waves, comprising:
   a negative differential resistance element;
   a resonator configured to prescribe an oscillation frequency of the electromagnetic waves;
   a voltage modulation unit configured to modulate a voltage of the negative differential resistance element with a modulation frequency;
   a stabilizing circuit configured to suppress parasitic oscillation; and
   a bias circuit, including a power supply and a line, used to control an operating point voltage of the negative differential resistance element,
   wherein the voltage modulation unit is connected to the bias circuit through the stabilizing circuit,
   wherein the modulation frequency is different from the oscillation frequency; and having
   a plurality of the voltage modulation units that are individually connected to the negative differential resistance element.

8. The oscillator according to claim 3,
   wherein
   the negative differential resistance element and the photodiode are integrally mounted on the same substrate.

9. An oscillator which oscillates electromagnetic waves, comprising:
   a negative differential resistance element;
   a resonator configured to prescribe an oscillation frequency of the electromagnetic waves;
   a voltage modulation unit configured to modulate a voltage of the negative differential resistance element with a modulation frequency;
   a stabilizing circuit configured to suppress parasitic oscillation; and
   a bias circuit, including a power supply and a line, used to control an operating point voltage of the negative differential resistance element,
   wherein the voltage modulation unit is connected to the bias circuit through the stabilizing circuit,
   wherein the modulation frequency is different from the oscillation frequency; and
   wherein, by controlling the operating point voltage, a frequency comb generator generates a plurality of electromagnetic waves having frequencies having intervals corresponding to a modulation frequency of the voltage modulation unit or an integral multiple of the modulation frequency in the vicinity of an oscillation frequency of the oscillator.

* * * * *